United States Patent
Yang et al.

(10) Patent No.: US 7,875,378 B2
(45) Date of Patent: Jan. 25, 2011

(54) VOLTAGE SENSING MEMBER AND BATTERY MODULE EMPLOYED WITH THE SAME

(75) Inventors: Heekook Yang, Daejeon (KR); Juyoung Kim, Daejeon (KR); Jongmoon Yoon, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 12/224,526

(22) PCT Filed: Feb. 28, 2007

(86) PCT No.: PCT/KR2007/001019
§ 371 (c)(1),
(2), (4) Date: Apr. 7, 2009

(87) PCT Pub. No.: WO2007/102671

PCT Pub. Date: Sep. 13, 2007

(65) Prior Publication Data

US 2009/0214936 A1 Aug. 27, 2009

(30) Foreign Application Priority Data

Mar. 6, 2006 (KR) .............. 10-2006-0020772
May 29, 2006 (KR) .............. 10-2006-0047891

(51) Int. Cl.
*H01M 2/00* (2006.01)
*H01M 2/24* (2006.01)
*H01M 10/48* (2006.01)
*G01R 31/36* (2006.01)

(52) U.S. Cl. .................. 429/61; 702/63; 429/90; 429/92; 429/152; 429/160; 429/163; 429/177

(58) Field of Classification Search .......... None
See application file for complete search history.

(56) References Cited

U.S. PATENT DOCUMENTS 4,957,829 A 9/1990 Holl (Continued)

FOREIGN PATENT DOCUMENTS

JP 2003-123721 A 4/2003

(Continued)

OTHER PUBLICATIONS

U.S. Appl. No. 12/224,687.
U.S. Appl. No. 12/224,688.
U.S. Appl. No. 12/224,689.

*Primary Examiner*—Dah-Wei D Yuan
*Assistant Examiner*—Edu E Enin-Okut
(74) *Attorney, Agent, or Firm*—Lerner, David, Littenberg, Krumholz & Mentlik, LLP (57) ABSTRACT

Disclosed herein is a voltage sensing member constructed in a structure in which linear mounting parts are mounted to supporting parts coupled to the bottom of a battery module, conductive sensing parts are mounted on the mounting parts while the conductive sensing parts are in elastic contact with electrode terminals of battery cells, and the sensing parts are electrically connected to a battery management system (BMS). The voltage sensing member according to the present invention is manufactured by a simple assembly process without using a plurality of members for mechanical coupling and electrical connection. Consequently, the present invention has the effect of reducing the manufacturing costs of the voltage sensing member. Also, the voltage sensing member is maintained in elastic and stable contact when external impact or frequent vibration is applied to the voltage sensing member. Consequently, the present invention has the effect of performing stable voltage sensing operation. Furthermore, the present invention has the effect of manufacturing a middle- or large-sized battery pack having desired output and capacity using a battery module including the voltage sensing member as a unit body.

16 Claims, 9 Drawing Sheets

U.S. PATENT DOCUMENTS

| | | |
|---|---|---|
| 5,558,950 A | 9/1996 | Ovshinsky et al. |
| 5,639,571 A | 6/1997 | Waters et al. |
| 6,304,057 B1 | 10/2001 | Hamada et al. |
| 6,569,561 B1 | 5/2003 | Kimura et al. |
| 6,818,343 B1 | 11/2004 | Kimoto et al. |
| 7,597,996 B2 * | 10/2009 | Ro et al. ............... 429/159 |
| 7,648,538 B2 * | 1/2010 | Oogami et al. ......... 429/162 |
| 2002/0182480 A1 * | 12/2002 | Hanauer et al. ........ 429/160 |
| 2003/0215702 A1 | 11/2003 | Tanjou et al. |
| 2005/0089751 A1 | 4/2005 | Oogami et al. |
| 2005/0100783 A1 | 5/2005 | Ro et al. |
| 2006/0093899 A1 | 5/2006 | Jeon et al. |
| 2006/0177734 A1 * | 8/2006 | Yao ........................ 429/160 |

FOREIGN PATENT DOCUMENTS

| | | |
|---|---|---|
| JP | 2005-108693 | 4/2005 |
| JP | 2005-209365 A2 | 8/2005 |
| KR | 20060047061 | 5/2006 |
| WO | 2005/074054 A1 | 8/2005 |

* cited by examiner

VOLTAGE SENSING MEMBER AND BATTERY MODULE EMPLOYED WITH THE SAME

FIELD OF THE INVENTION

The present invention relates to a voltage sensing member mounted to a lower case of a battery module for sensing the voltage of battery cells and transmitting the sensed voltage to a battery management system (BMS), and, more particularly, to a voltage sensing member including clip-shaped mounting parts protruding upward such that the mounting parts are connected to electrode terminal connections of battery cells, conductive spring sensing parts mounted to the protruding parts, printed circuit boards (PCBs) to which the lower ends of the mounting parts are coupled, a connection part for electrically interconnecting the front and rear PCBs, and a connector mounted to the rear PCB such that the connector is connected to the BMS.

BACKGROUND OF THE INVENTION

Recently, a secondary battery, which can be charged and discharged, has been widely used as an energy source for wireless mobile devices. Also, the secondary battery has attracted considerable attention as an energy source for electric vehicles (EV) and hybrid electric vehicles (HEV), which have been developed to solve problems, such as air pollution, caused by existing gasoline and diesel vehicles using fossil fuel.

Small-sized mobile devices use one or several small-sized battery cells for each device. On the other hand, middle- or large-sized devices, such as vehicles, use a middle- or large-sized battery module having a plurality of battery cells electrically connected with each other because high output and large capacity are necessary for the middle- or large-sized devices.

Preferably, the middle- or large-sized battery module is manufactured with small size and small weight if possible. For this reason, a prismatic battery or a pouch-shaped battery, which can be stacked with high integration and has a small weight to capacity ratio, is usually used as a battery cell of the middle- or large-sized battery module. Especially, much interest is currently generated in the pouch-shaped battery, which uses an aluminum laminate sheet as a sheathing member, because the weight of the pouch-shaped battery is small and the manufacturing costs of the pouch-shaped battery are low.

Also, since a battery module is a structural body including a plurality of battery cells which are combined with each other, the safety and the operating efficiency of the battery module are lowered when overvoltage, overcurrent, and overheat occurs in some of the battery cells. Consequently, a sensing unit for sensing the overvoltage, overcurrent, and overheat is needed. Specifically, a voltage sensor is connected to the battery cells so as to sense and control the operation of the battery cells in real time or at predetermined time intervals. However, the attachment or the connection of the sensing unit complicates the assembly process of the battery module. In addition, short circuits may occur due to the provision of a plurality of wires necessary for the attachment or the connection of the sensing unit. Also, as the secondary batteries are used as a power source for vehicles due to the extension in application of the secondary batteries, there is needed a coupling unit for maintaining the elastic and stable contact between the sensing unit and the secondary batteries when strong impact or vibration is applied to the battery module.

In addition, when a middle- or large-sized battery module is constructed using a plurality of battery cells or a plurality of unit modules each of which includes a predetermined number of battery cells, a plurality of members for mechanical coupling and electrical connection between the battery cells or the unit modules are needed, and a process for assembling the mechanical coupling and electrical connection members is very complicated. Furthermore, there is needed a space for coupling, welding, or soldering the mechanical coupling and electrical connection members with the result that the total size of the system is increased. The increase in size of the system is not preferred in the above-described aspect. Consequently, there is high necessity for a battery module that is compact and structurally stable.

SUMMARY OF THE INVENTION

Therefore, the present invention has been made to solve the above problems, and other technical problems that have yet to be resolved.

Specifically, it is an object of the present invention to provide a voltage sensing member that is manufactured by a simple assembly process without using a plurality of members for mechanical coupling and electrical connection.

It is another object of the present invention to provide a voltage sensing member that is maintained in elastic and stable contact when external impact or frequent vibration is applied to the voltage sensing member during the assembly or the operation of the voltage sensing member.

It is a further object of the present invention to provide a middle- or large-sized battery module that is manufactured with desired output and capacity including the voltage sensing member.

In accordance with one aspect of the present invention, the above and other objects can be accomplished by the provision of a voltage sensing member for sensing the voltage of battery cells constituting a battery module, the voltage sensing member comprising:

(a) a pair of supporting parts mounted to the bottom of the battery module at regions (the front and rear parts of the battery module) corresponding to electrode terminal connections of the battery cells;

(b) a connection part for electrically interconnecting the supporting parts;

(c) a plurality of linear mounting parts protruding upward while one end of each linear mounting part is fixed to the corresponding support part;

(d) a plurality of conductive sensing parts electrically connected to the corresponding supporting parts while the conductive sensing parts are mounted to the respective mounting parts, the conductive sensing parts being elastically connected to electrode terminals of the battery cells; and (e) a connector mounted on the front supporting part or the rear supporting part for transmitting the sensed voltage of the battery cells to a battery management system (BMS).

Consequently, the voltage sensing member is constructed in a structure in which the linear mounting parts are mounted to the supporting parts coupled to the bottom of the battery module, the conductive sensing parts are mounted on the mounting parts while the conductive sensing parts are in elastic contact with the electrode terminals of the battery cells, and the sensing parts are electrically connected to the BMS. Consequently, a process for assembling the voltage sensing member is simple, and the voltage sensing member is constructed in a compact structure to stably sense the voltage of the battery cells.

The supporting parts are plate-shaped members located at the regions of the battery module corresponding to the electrode terminal connections of the battery cell, i.e., at the bottom of the front and rear part of the battery module. The supporting parts serve to mechanically couple with voltage sensors according to the present invention and to electrically connect the voltage sensors to the BMS. Preferably, therefore, the front supporting part and the rear supporting part are formed of a printed circuit board (PCB).

The mounting parts are constructed in a linear structure in which the mounting parts protrude upward while one end of each linear mounting part is fixed to the corresponding support part. The sensing parts are mounted on the linear structure for sensing the voltage of the battery cells. It is required that the mounting parts have a mechanical strength higher than a predetermined level and the sensing parts be maintained in elastic contact with the electrode terminals so as to the support the mounted sensing parts. Preferably, therefore, the mounting parts are formed of an elastic metal strip, and the electrode terminal-side end of the mounting parts are constructed in a structure in which the regions of the mounting parts facing the electrode terminals are inclined downward (tapered).

The sensing parts are a plurality of conductive members electrically connected to the corresponding supporting parts while being mounted on the corresponding mounting parts and in elastic contact with the electrode terminals of the battery cells. Sensing the voltage of the battery module is accomplished in a contact fashion using a predetermined conductive member as a connecting member. Consequently, the material of the conductive member is not particularly restricted. Preferably, however, the sensing parts are constructed in a conductive compression spring structure.

In accordance with another aspect of the present invention, there is provided a battery module including the voltage sensing member constructed as described above.

In a preferred embodiment, the battery module comprises:

(a) a battery cell stack including a plurality of battery cells or unit modules connected in series with each other, the battery cells or unit modules being erected in the lateral direction;

(b) an upper case constructed in a structure to entirely surround one side end of the battery cell stack and to partially surround the upper and lower ends of the battery cell stack, the upper case being provided at the front part thereof with external input and output terminals;

(c) a lower case coupled with the upper case, the lower case being constructed in a structure to entirely surround the other side end of the battery cell stack and to partially surround the upper and lower ends of the battery cell stack, the lower case being provided at the front part thereof with bus bars for connecting electrode terminals of the battery cell stack to the external input and output terminals, the lower case being provided at the bottom thereof with the voltage sensing member;

(d) a front cover mounted to the front part of the lower case for protecting connections between the electrode terminals of the battery cells and the bus bars from the outside, the front cover being made of an insulative material; and (e) a battery management system (BMS) mounted to the rear part of the lower case, while being connected to the voltage sensing member, for monitoring and controlling the operation of the battery module.

In a battery module including a plurality of battery cells, it is necessary to measure and control the voltage and temperature of the battery cells in consideration of the safety and operational efficiency of the battery module. Especially, it is necessary to measure the voltage of the respective battery cells or the respective electrical connection regions of the battery cells. For this reason, the attachment of a sensing member for measuring the voltage or temperature of the battery cells is one of the principal factors further complicating the construction of the battery module.

The above-mentioned problem may be solved by the provision of a sensing member mounted along one of the cases, i.e., the upper case or the lower case, for sensing the voltage and/or temperature of the battery cells in accordance with the present invention. Specifically, as described above, the sensing member includes sensing parts mounted in spaces defined on the front and rear parts of the lower case and a conduction part for interconnecting the sensing parts. As described above, the sensing member may be a voltage sensing member. According to circumstances, the sensing member may be a temperature sensing member.

In a preferred embodiment, the lower case is provided at the front and rear parts thereof with spaces in which supporting parts and sensing parts of the voltage sensing member are inserted, and the sensing parts are in elastic contact with the lower ends of the electrode terminals of the battery cells and/or series-connection bent regions of the electrode terminals of the battery cells, whereby the electrical contact therebetween is stably maintained when external impact is applied to the battery module.

The lower case is provided at the bottom thereof with a depression in which the connection part is inserted, whereby the battery module is constructed in a compact structure. Preferably, the depression is provided at the inside thereof with a plurality of protrusions which are alternately oriented to stably fix the connection part inserted in the depression.

As described above, the battery cell stack is mounted in the cases in such a manner that the plurality of battery cells or unit modules are erected in the lateral direction. In the specification, regions of the battery cells or the unit modules where the electrode terminals of the battery cells or the unit modules protrude are defined as front and rear directions, and the opposite side edges of the battery cells or the unit modules are defined as a lateral direction. Consequently, the battery cell stack is constructed in a structure in which the battery cells or the unit modules are erected such that one of the side edges of the battery cells or the unit modules is erected with respect to the ground while the electrode terminals of the battery cells or the unit modules are oriented in the front and rear directions of the battery module.

Preferably, the battery cell stack comprises a plurality of unit modules each including plate-shaped battery cells having electrode terminals formed at the upper and lower ends thereof. Each unit module comprises two or more battery cells constructed in a stacked structure in which electrode terminals of the battery cells are connected in series with each other and the electrode terminal connections are bent such that the battery cells are stacked, and a pair of high-strength cell covers for surrounding the outer surfaces of the battery cells excluding the electrode terminals of the battery cells when the cell covers are coupled with each other.

The battery cells are connected in series and/or parallel with each other in one unit module, or the battery cells of one unit module are connected in series and/or parallel with the battery cells of another unit module. In the preferred embodiment described above, a plurality of unit modules are manufactured by coupling electrode terminals of the battery cells to each other, while arranging the battery cells in series in the longitudinal direction, such that the electrode terminals of the battery cells are successively adjacent to each other, bending the battery cells by twos or more such that the battery cells are stacked while being in tight contact with each other, and surrounding the stacked battery cells by predetermined numbers with the cell covers. The sequence of the manufacturing processes may be partially changed. For example, the plurality of unit modules may be manufactured, and then the electrical connection between the unit modules may be performed.

The battery cell stack, in which the battery cells are stacked in high integration while the electrode terminals of the battery cells are connected with each other, is vertically mounted in the separable upper and lower cases that are coupled with each other in the assembly-type coupling structure.

Preferably, the upper and lower cases are constructed in a structure to surround the edge of the battery cell stack and expose the outer surfaces of the battery cell stack to the outside so as to accomplish easy heat dissipation of the battery cell stack when the upper and lower cases are coupled with each other after the battery cell stack is mounted in the upper and lower cases. Consequently, as described above, the upper case is constructed in a structure to entirely surround one side end of the battery cell stack and to partially surround the upper and lower ends of the battery cell stack, and the lower case is constructed in a structure to entirely surround the other side end of the battery cell stack and to partially surround the upper and lower ends of the battery cell stack.

In a preferred embodiment, the upper and lower cases are provided in the insides thereof with a plurality of mounting grooves in which the edges of the battery cells or the unit modules are inserted.

When the battery cell stack includes a plurality of unit modules, the cell covers of the unit modules are provided at the outer surfaces adjacent to the upper and lower ends thereof with steps of a predetermined size for easily fixing the unit modules, and the cell covers are provided at the outer surfaces adjacent to the opposite sides thereof with steps of a predetermined size for easily fixing the unit modules, such that the battery cell stack is stably mounted to the cases and the unit modules are stacked while being in tighter contact with each other, whereby the overall size of the battery cell stack is reduced. The mounting grooves of the upper and lower cases are constructed in a structure corresponding to the steps.

Consequently, the steps formed adjacent to the edges of the unit modules are inserted in the mounting grooves of the upper and lower cases, whereby a very stable coupling structure is formed even though only the edges of the unit modules are fixed to the cases.

Preferably, the lower case is provided at the front part thereof with a pair of slits through which the outermost electrode terminals of the battery cell stack are inserted. When the battery cell stack is mounted to the lower case, the outermost electrode terminals of the battery cell stack are exposed through the slits and then bent such that the outermost electrode terminals of the battery cell stack are brought into tight contact with the front part of the lower case. Consequently, the outermost electrode terminals of the battery cell stack are more easily connected to the bus bars located at the front part of the lower case.

According to circumstances, a conductive member may be further mounted to at least one of the external input and output terminals for fixing the upper end of the front cover and assisting with the connection of a power cable necessary for electrical connection. Each conductive member may include bent parts for elastically surrounding the power cable. In addition, the front cover may be provided with holes for fixing the power cable. Insulative coupling members are inserted through the corresponding fixing holes such that the insulative coupling members are coupled with some of the power cable.

Preferably, the front cover is coupled to the lower case in an assembly coupling fashion.

The upper and lower cases are coupled with each other by mounting the battery cell stack to one of the upper and lower cases (for example, the lower case) and coupling the other case (for example, the upper case) to the frame member in which the battery cell stack is mounted. The coupling between the upper and lower cases may be accomplished in various manners. For example, screws may be threadedly inserted into thread grooves formed at the opposite sides of the cases. Alternatively, a hook may be formed at one of the cases, and a coupling hole corresponding to the hook may be formed in the other case, whereby the coupling between the upper and lower cases is accomplished without using an additional coupling member.

Preferably, the lower case is provided at the lower end of the front and/or rear part thereof with a coupling part which protrudes from the lower case and has a through-hole in the center thereof such that the lower case is fixed to an external device.

The mounting parts of the voltage sensing member may be constructed in a structure in which the other ends of the mounting parts opposite to the ends of the mounting parts which are connected to the supporting parts are inclined downward such that the other ends of the mounting parts are easily inserted into the lower ends of the electrode terminals of the battery cells and/or the series-connection bent regions of the electrode terminals of the battery cells. Preferably, the outermost mounting parts connected to the outermost electrode terminals are mounted on the supporting part such that the downward-inclined ends of the outermost mounting parts are rotated by a predetermined angle to face the insides of the outermost electrode terminals.

Also, the sensing parts of the voltage sensing member are mounted in the front and rear parts of the lower case. The sensing parts mounted in the rear part of the lower case may be directly connected to the BMS mounted to the rear part of the lower case, and the sensing parts mounted in the front part of the lower case may be connected to the BMS via the conduction part mounted to the bottom of the lower case.

In a preferred embodiment, the sensing member includes thermistors, as temperature sensing parts, mounted to the battery cells or unit modules of the battery cell stack. The thermistors are connected to the BMS.

On the other hand, the lower case may be provided at the rear part thereof with a protruding BMS receiving part in which the BMS is integrally assembled, preferably the BMS is received. The BMS receiving part may be provided with a thermistor connector and a communication connector.

Insulative covers are further disposed on the outer surfaces of the supporting parts mounted to the bottom of the lower case, thereby increasing isolation of the supporting parts from the outside and improving the mechanical coupling degree between the supporting parts and the lower case.

When a plurality of battery modules are used to construct a middle- or large-sized battery system, as described above, BMSs mounted to the respective battery modules may be said to be 'slave BMSs.'

The middle- or large-sized battery module according to the present invention is constructed in a compact structure, and the mechanical coupling and electrical connection of the middle- or large-sized battery module are stably accomplished without using a plurality of members. Also, it is possible to construct a battery module using a predetermined number of battery cells, for example, four, six, eight, or ten battery cells, thereby effectively mounting a necessary number of battery modules in a limited space.

In accordance with a further aspect of the present invention, there is provided a middle- or large-sized battery system having high output and large capacity, the battery system being constructed by connecting a plurality of battery modules.

The middle- or large-sized battery system according to the present invention may be manufactured by combining unit modules based on desired output and capacity. The battery system according to the present invention is preferably used as a power source for electric vehicles, hybrid electric vehicles, electric motorcycles, or electric bicycles, which have a limit installation space and are exposed to frequent vibration and strong impact in consideration of the installation efficiency and structural stability of the battery system.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF PREFERRED EMBODIMENTS

Now, preferred embodiments of the present invention will be described in detail with reference to the accompanying drawings. It should be noted, however, that the scope of the present invention is not limited by the illustrated embodiments.

Figure 1:
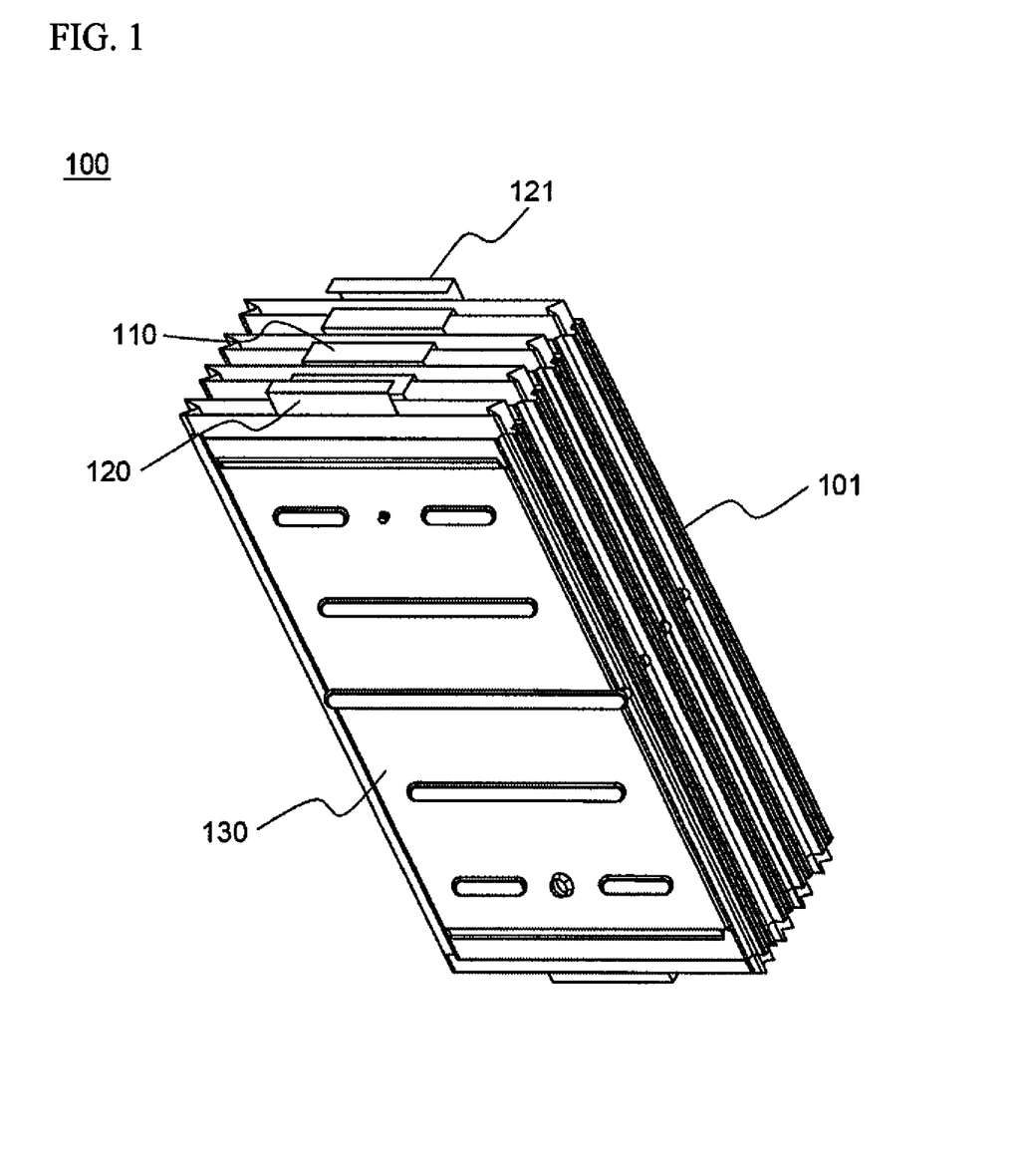
FIG. 1 is an assembled perspective view illustrating a battery cell stack constructed by stacking a plurality of battery cells surrounded by cell covers.

FIG. 1 is a perspective view illustrating a battery cell stack including a plurality of unit modules.

Referring to FIG. 1, the battery cell stack 100 includes four unit modules 101 and 130. Two battery cells (not shown) are mounted in each unit module 130. Consequently, a total of eight battery cells are included in the battery cell stack 100. Electrode terminals of the neighboring battery cells are connected in series with each other, and electrode terminals of the neighboring unit modules are also connected in series with each other. Electrode terminal connections 110 are bent in the sectional shape of a '[' to construct the battery cell stack. Outside electrode terminals 120 and 121 of the outermost unit modules 130 and 101 are bent inward in the sectional shape of a ']' such that the electrode terminals 120 and 121 protrude slightly more than the electrode terminal connections 110.

Figure 2:
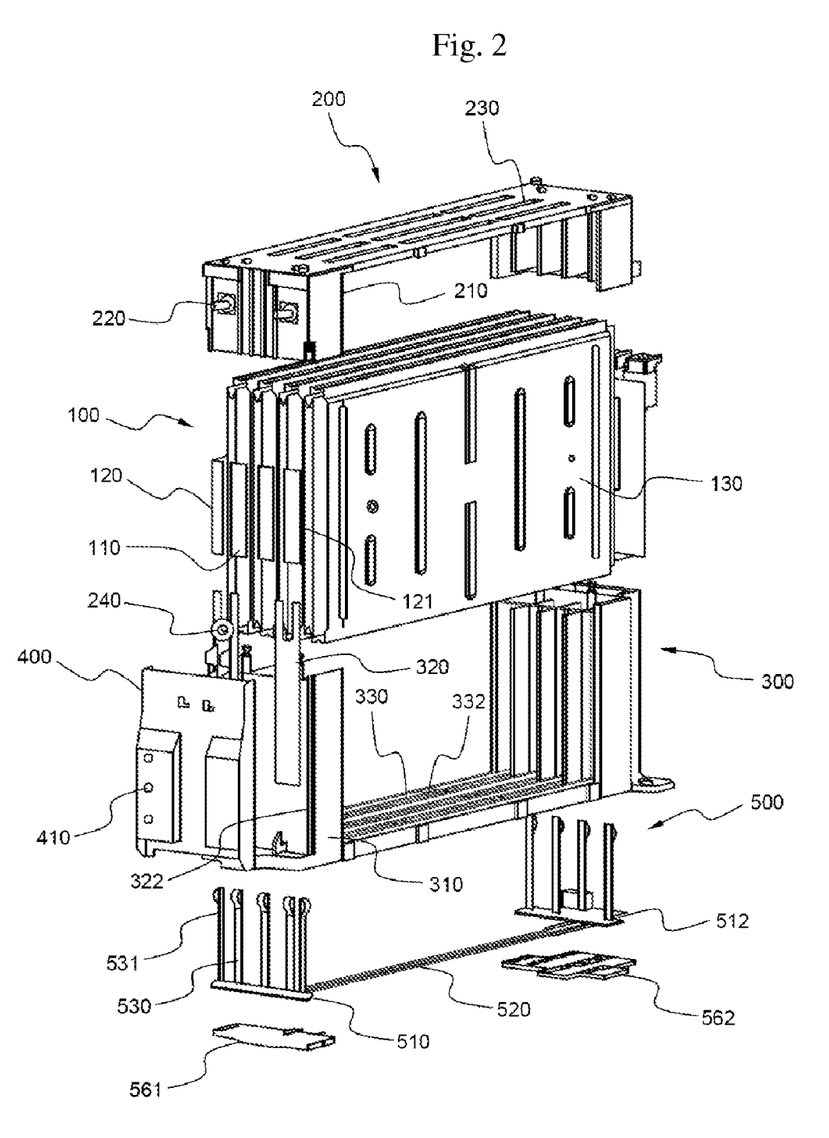
FIG. 2 is an exploded perspective view illustrating upper and lower cases for surrounding the battery cell stack and a voltage sensing member mounted to the lower case.

FIG. 2 is an exploded perspective view illustrating upper and lower cases and a voltage sensing member of a middle- or large-sized battery module according to a preferred embodiment of the present invention.

Referring to FIG. 2, the upper case 200 is constructed in a structure to entirely surround one side end of the battery cell stack 100 and to partially surround the upper and lower ends of the battery cell stack 100. The upper case 200 is provided at the front part 210 thereof with a pair of external input and output terminals 220.

The battery cell stack 100 is mounted to the lower case 300 such that the plurality of unit modules 130 are erected in the lateral direction.

The lower case 300 is constructed in a structure to entirely surround the other side end of the battery cell stack 100 and to partially surround the upper and lower ends of the battery cell stack 100. The lower case 300 is coupled with the upper case 200. The lower case 300 is provided at the front part 310 thereof with a pair of bus bars 320 for connecting electrode terminals of the battery cell stack 100 to the external input and output terminals 220. Specifically, the upper and lower cases 200 and 300 are constructed in a structure in which, when the upper and lower cases 200 and 300 are coupled with each other, the upper and lower cases 200 and 300 surround only the edge of the battery cell stack 100, such that the outer surface of the battery cell stack 100 is exposed to the outside, so as to accomplish easy heat dissipation of the battery cell stack 100.

The upper end of each bus bar 320 is formed in the shape of a depression such that the external input and output terminals 220 provided at the front part 210 of the upper case 200 are inserted into the depressions of the bus bars 320 when the upper and lower cases 200 and 300 are coupled with each other.

In the insides of the upper case 200 and the lower case 300 are formed a plurality of mounting grooves 330 in which the edges of the battery cells or the unit modules are inserted. The mounting grooves 330 are constructed in a structure in which steps formed at the edges of the unit modules 130 are fitted in the corresponding mounting grooves 330.

Also, the upper case 200 and the lower case 300 are provided with a plurality of through-holes 230 and 332, through which a coolant (normally, air) flows, respectively, whereby effective cooling is accomplished while the battery cell stack 100 is mounted in the upper case 200 and the lower case 300.

To the front part 310 of the lower case 300 is mounted a front cover 400 for protecting connections between the electrode terminals of the battery cells and the bus bars from the outside. The front cover 400 is made of an insulative material.

To the external input and output terminals 220 are further mounted conductive members 240 for fixing the upper end of the front cover 400 and assisting with the connection of a power cable (not shown) necessary for electrical connection. For easy understanding, the conductive members 240 are shown to be separated from the external input and output terminals 220 and located in front of the bus bars 320 in the drawing. Each conductive member 240 is provided at one side thereof with a coupling insertion hole through which the corresponding external input and output terminal 220 is inserted. Also, each conductive member 240 includes a pair of bent parts for elastically surrounding the power cable.

The front cover 400 is provided with fixing holes 410 for fixing the power cable. Insulative coupling members (not shown) are inserted through the corresponding fixing holes 410 such that the insulative coupling members are coupled with some of the power cable.

The lower case 300 is provided at the front part 310 thereof with a pair of slits 322 which are formed at the right and left sides of the front part 310 of the lower case 300 such that the outermost electrode terminals 120 and 121 of the battery cell stack 100 are inserted through the corresponding slits 322. When the battery cell stack 100 is mounted to the lower case 300, the outermost electrode terminals 120 and 121 of the battery cell stack 100 are exposed through the slits 322 and then bent such that the outermost electrode terminals 120 and 121 of the battery cell stack 100 are brought into tight contact with the front part 310 of the lower case 300. Consequently, the outermost electrode terminals 120 and 121 of the battery cell stack 100 are more easily connected to the bus bars 320 located at the front part 310 of the lower case 300.

The voltage sensing member 500, which is mounted at the bottom of the front and rear parts of the lower case 300, includes a pair of supporting parts 510 and 512 mounted to the bottom of the battery module at regions corresponding to the electrode terminal connections 110 of the battery cells or the unit modules, a wire-shaped connection part 520 for electrically interconnecting the supporting parts 510 and 512, a plurality of linear mounting parts 530 and 531 each having one end fixed to the corresponding support part 510 or 512 and the other end elastically connected to the corresponding electrode terminal connection 110, and insulative covers 561 and 562 mounted to the bottom of the voltage sensing member 500.

The mounting parts 530 are constructed in a structure in which the mounting parts 530 are in elastic contact with the lower ends of the electrode terminals of the battery cells and/or the series-connection bent regions of the electrode terminals of the battery cells, i.e., the lower end of the electrode terminal connections 110. The other ends of the mounting parts 530 opposite to the ends of the mounting parts 530 which are connected to the supporting parts 510 and 512 are inclined downward such that the other ends of the mounting parts 530 are easily inserted into the lower ends of the electrode terminals of the battery cells and/or the electrode terminal connections 110. Also, the outermost mounting parts 531 formed at the front part 310 of the lower case 300, which are connected to the outermost electrode terminals 120, are mounted on the supporting part 510 such that the outermost mounting parts 531 are rotated by 90 degrees to face the insides of the outermost electrode terminals 120. On the upper ends of the mounting parts 530 are mounted conductive compression springs (not shown) in a fitting fashion.

The structure of the voltage sensing member 500 will be described in more detail with reference to FIGS. 5 to 8.

Figure 3:
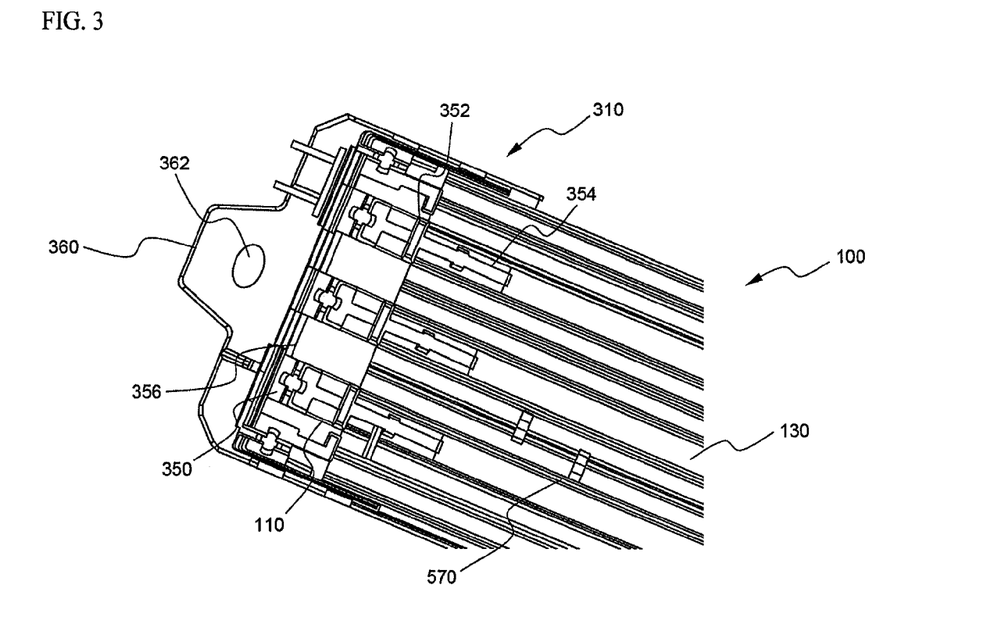
FIGS. 3 and 4 are partially enlarged views respectively illustrating the lower and upper ends of the lower case.
Figure 4:
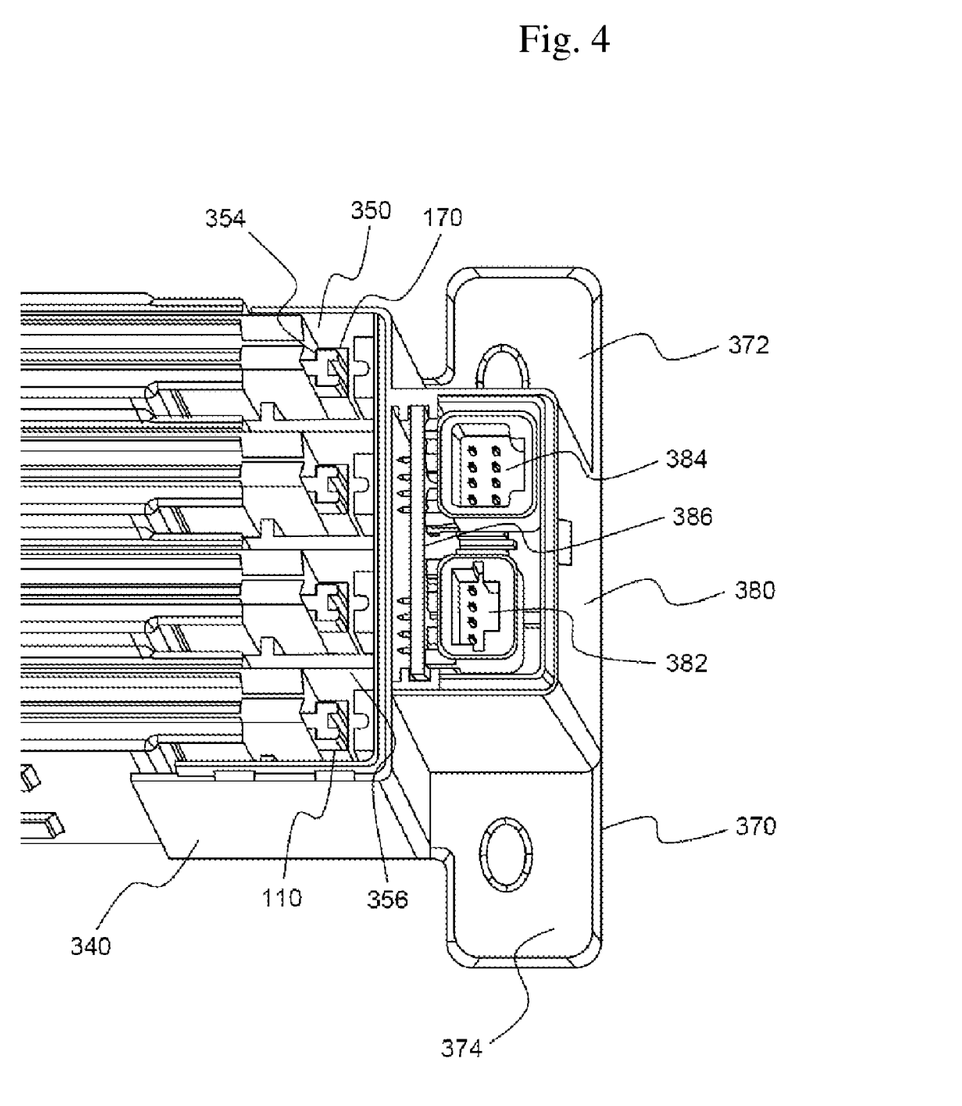
Figure 5:
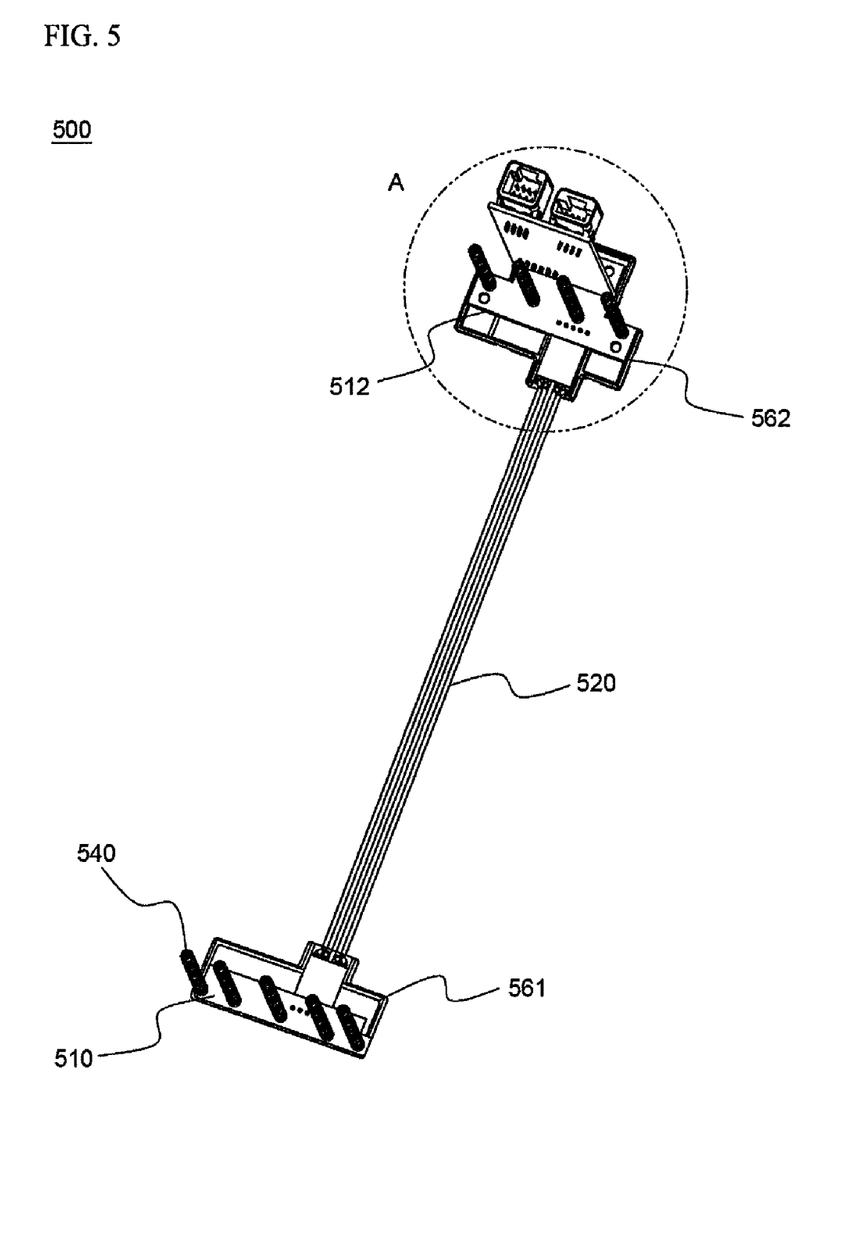
FIGS. 5 and 6 are a perspective view and a partially enlarged view illustrating a voltage sensing member according to a preferred embodiment of the present invention.
Figure 6:
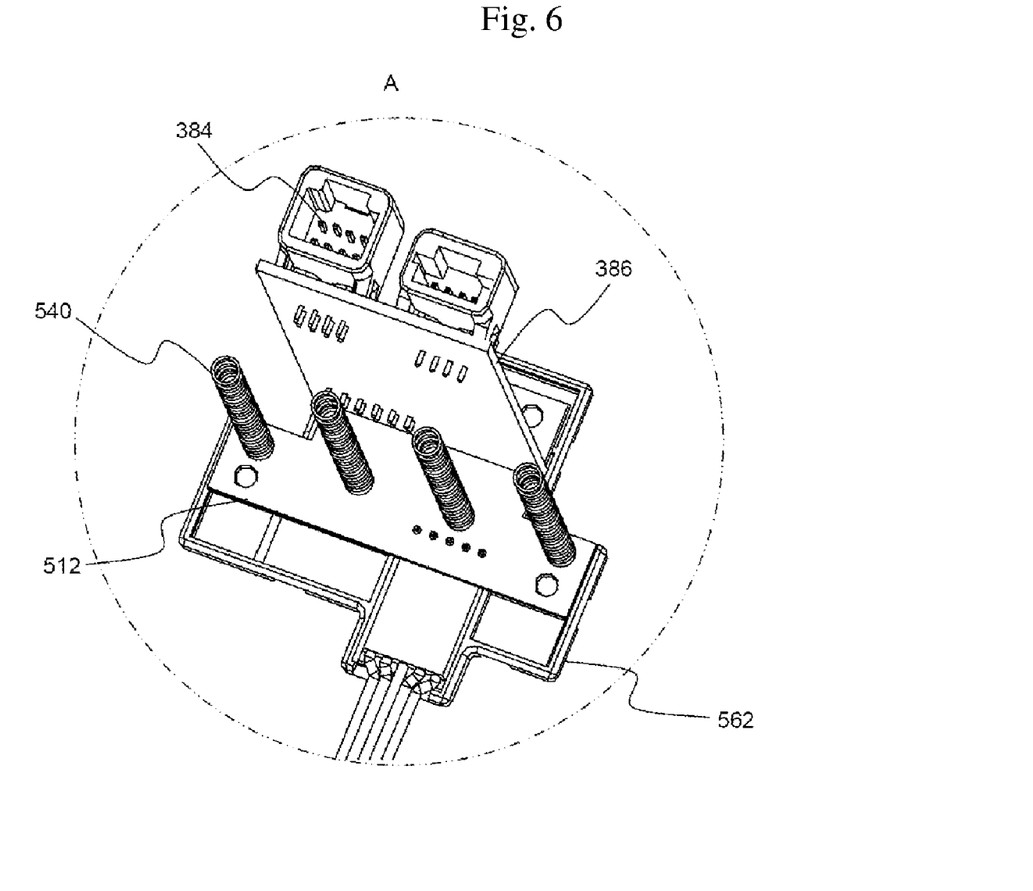
Figure 7:
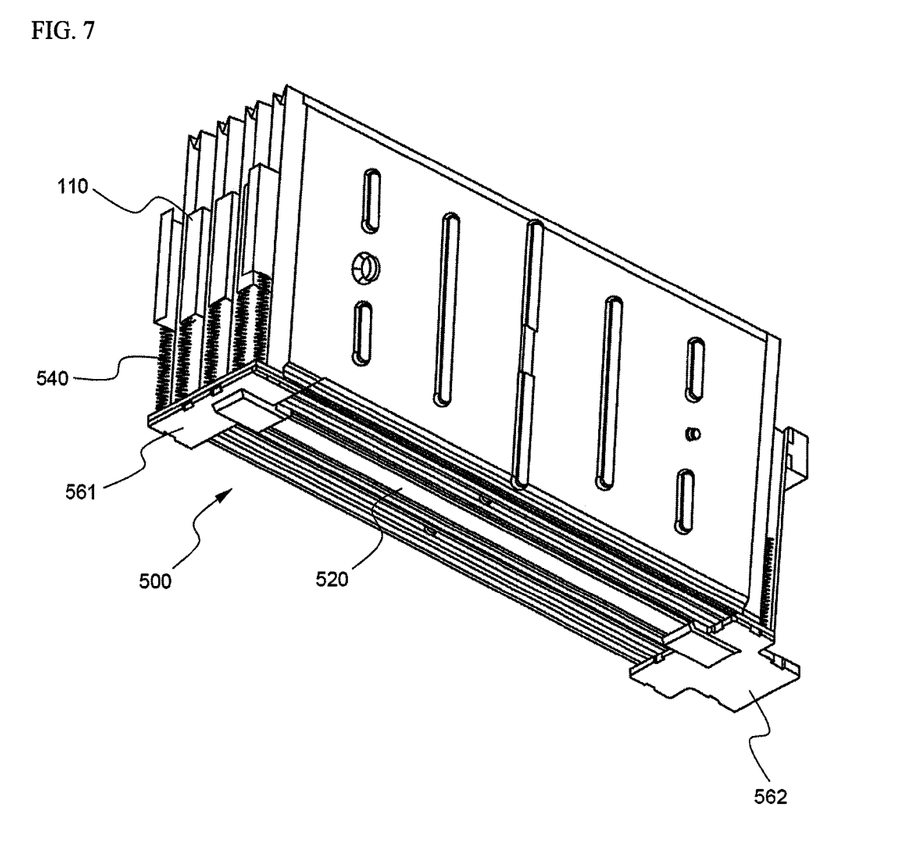
FIG. 7 is a perspective view illustrating the coupling between the voltage sensing member according to the present invention and the battery cells.
Figure 8:
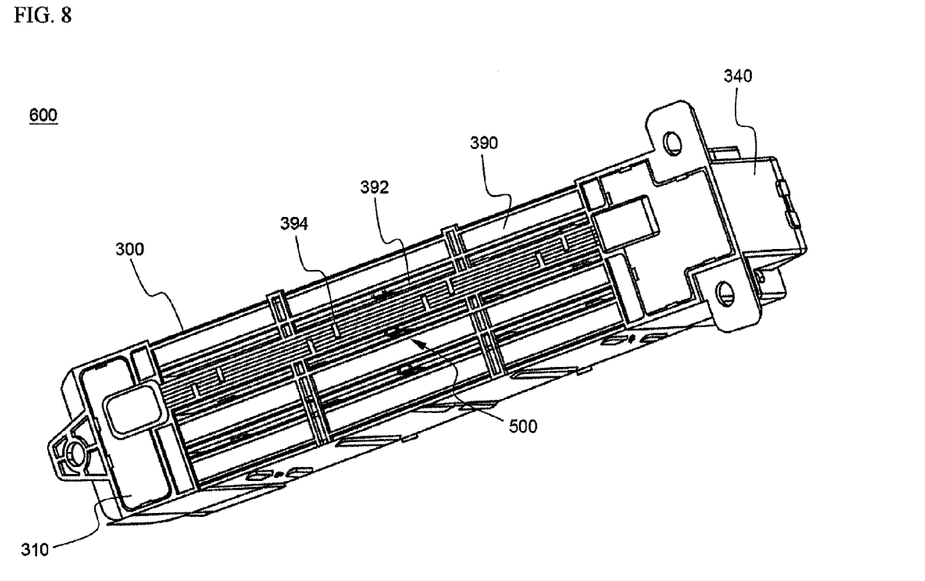
FIGS. 8 to 10 are perspective views illustrating a middle- or large-sized battery pack according to a preferred embodiment of the present invention.

FIGS. 3 and 4 are partial plan views respectively illustrating the front and rear parts of the middle- or large-sized battery module according to the present invention when unit modules are mounted to the lower case of the middle- or large-sized battery module.

Referring to these drawings, the lower case 300 is provided at the insides of the front part 310 and the rear part 340 thereof with a plurality of fixing grooves 350 in which the electrode terminal connections 110 of the unit modules 130 and electrode terminal connections 170 of the battery cells mounted in the respective unit modules 120 are inserted. The fixing grooves 350 are formed approximately in a shape corresponding to the electrode terminal connections 110 and 170. Consequently, the fixing grooves 350 prevent the battery cell stack 100 from moving forward and rearward and maintain stable insulation between the neighboring electrode terminal connections. Specifically, a cell cover movement preventing protrusion 352, a cell cover fixing guide 354, and an electrode terminal isolation wall 356 are formed in each fixing groove 350 for accomplishing more stable fixing and insulation of the unit modules 130.

Also, the lower case 300 is provided at the lower end of the front part thereof with a coupling part 360 which protrudes from the lower case 300 and has a through-hole 362 in the center thereof such that the lower case 300 is fixed to an external device (not shown).

Especially, a protruding coupling part 370 formed at the lower end of the rear part of the lower case 300 includes a pair of opposite coupling parts 372 and 374. The coupling part 372 is formed such that the coupling part 372 is higher by a height equivalent to the thickness of the coupling part 374 than the coupling part 374. Consequently, when a middle- or large-sized battery system is manufactured using a plurality of battery modules, the coupling between the battery modules is easily accomplished, and the battery system is manufactured in a compact structure.

At the rear part 340 of the lower case 300 is mounted a battery management system (BMS) 386. The BMS 386 is received in a BMS receiving part 380 integrally formed at the lower case 300. A thermistor connector 382 and a communication connector 384 are mounted at the BMS receiving part 380.

FIGS. 5 to 8 are perspective views illustrating a voltage sensing member used in the middle- or large-sized battery module according to the present invention and how to mount the voltage sensing member to the battery module.

Referring to these drawings, the voltage sensing member 500 includes a pair of supporting parts 510 and 512 mounted to the bottom of the battery module 600 at regions corresponding to the electrode terminal connections 110 (see FIGS. 1 and 2) of the battery cells or the unit modules, a wire-shaped connection part 520 for electrically interconnecting the supporting parts 510 and 512, a plurality of conductive compression springs 540 each having one end fixed to the corresponding support part 510 or 512 and the other end elastically connected to the corresponding electrode terminal connection 110, a BMS 386 mounted on the rear supporting part 512, a connector 384, and insulative covers 561 and 562 mounted to the bottom of the voltage sensing member 500.

Although not shown in the drawings, the conductive compression springs 540 are mounted on the supporting parts 510 and 512 in such a manner that linear mounting parts 530 (see FIG. 2) are inserted through the hollow parts of the conductive compression springs 540. During the assembly of the battery module, the conductive compression springs 540 are compressed by the lower ends of the electrode terminals 120 or the electrode terminal connections 110, whereby the electrical connection is accomplished. As the sensing parts for sensing the voltage of the battery cells are constructed using the conductive compression springs 540, the elastic contact between the sensing parts and the electrode terminals or the electrode terminal connections is accomplished, and the electrical connection between the sensing parts and the electrode terminals or the electrode terminal connections is stably maintained when external impact is applied to the battery module. The conduction springs are constructed in a structure to sense the voltage of the battery cells from the respective electrode terminals of the battery cells or the unit modules.

The conductive compression springs 540 are connected to the BMS 386 via the wire-shaped connection part 520 mounted to the bottom of the lower case 300. The lower case 300 is provided at the bottom 390 thereof with a depression 392 in which the connection part 520 is inserted. At the inside of the depression 392 are formed a plurality of protrusions 394 which are alternately oriented to stably fix the connection part 520 inserted in the depression 392.

Consequently, the voltage sensing member 500 is mounted to the front part 310, the rear part 340, and the bottom 590 of the lower case 300 in an insertion fashion. Consequently, the battery module 600 is easily assembled and constructed in a compact and stable structure.

Figure 9:
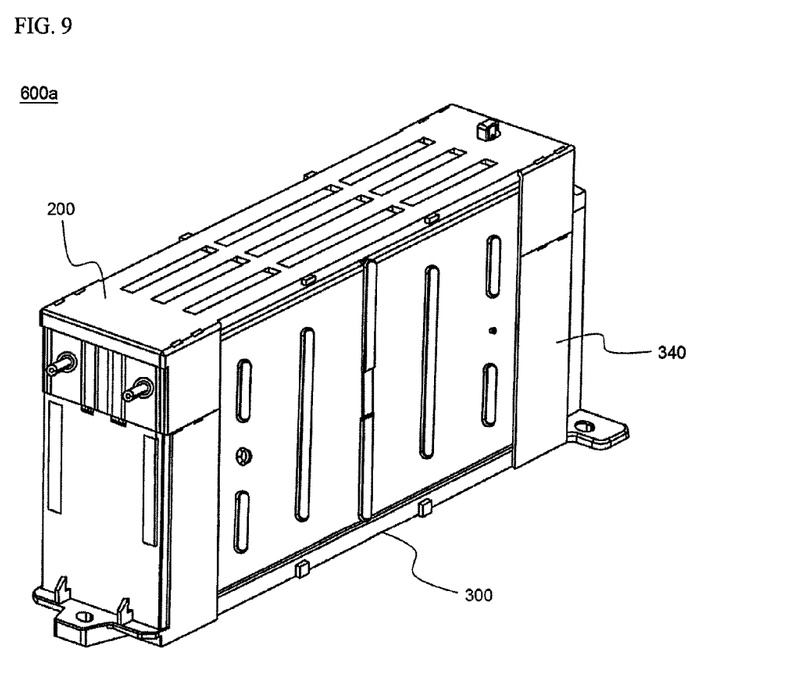
Figure 10:
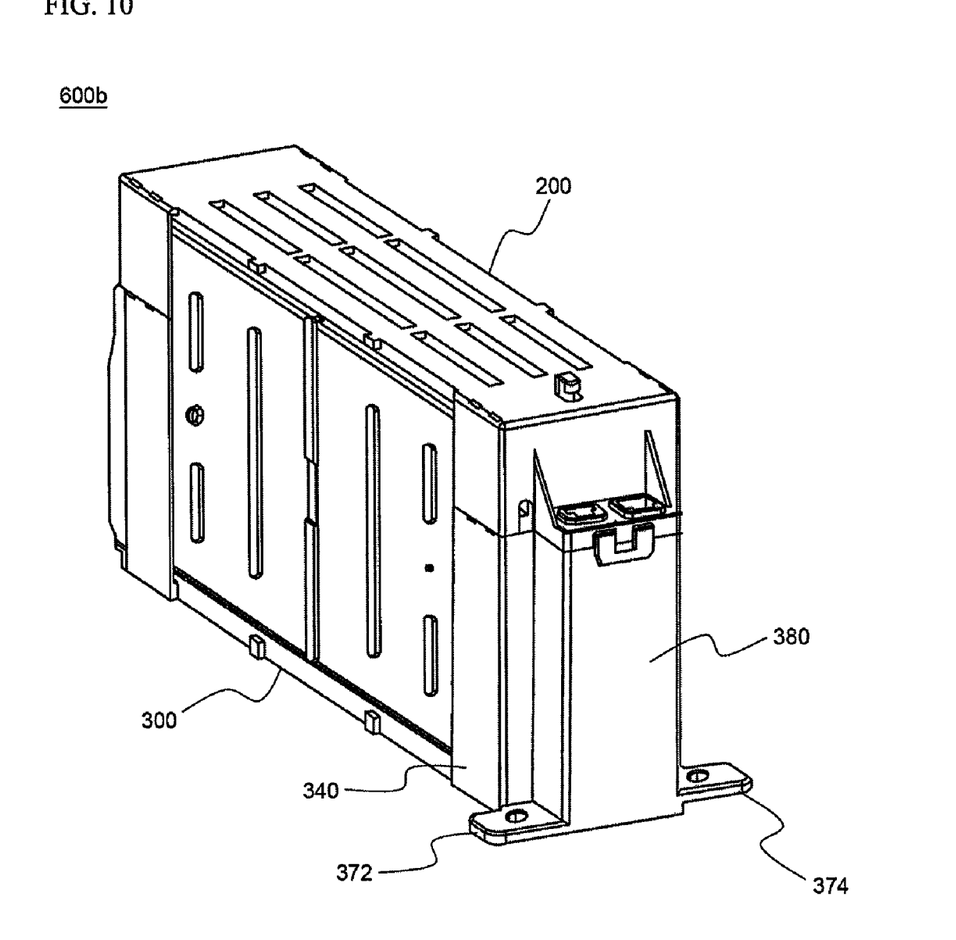

FIGS. 9 and 10 are perspective views illustrating partially assembled states of middle- or large-sized battery modules according to the present invention.

Referring to these drawings, the battery modules 600*a* and 600*b* are easily assembled by the coupling between the upper and lower case 200 and 300. The BMS (not shown) is received in the BMS receiving part 380 integrally formed at the rear part 340 of the lower case 300. Consequently, the battery modules 600*a* and 600*b* are constructed in a simple and compact structure. Also, the connection between battery modules may be accomplished by the coupling between the pair of coupling parts 372 and 374 formed at the lower end of the rear part 340 of the lower case 300 such that the pair of coupling parts 372 and 374 have different heights.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As apparent from the above description, the voltage sensing member according to the present invention is manufactured by a simple assembly process without using a plurality of members for mechanical coupling and electrical connection. Consequently, the present invention has the effect of reducing the manufacturing costs of the voltage sensing member. Also, the voltage sensing member is maintained in elastic and stable contact when external impact or frequent vibration is applied to the voltage sensing member. Consequently, the present invention has the effect of performing a stable voltage sensing operation. Furthermore, the present invention has the effect of manufacturing a middle- or large-sized battery pack having desired output and capacity using a battery module including the voltage sensing member as a unit body.

What is claimed is:

1. A voltage sensing member for sensing the voltage of battery cells constituting a battery module, the voltage sensing member comprising:
    (a) a pair of supporting parts mounted to the bottom of the battery module at regions corresponding to electrode terminal connections of the battery cells, wherein the pair of supporting parts is a front supporting part and a rear supporting part;
    (b) a connection part for electrically interconnecting the supporting parts;
    (c) a plurality of linear mounting parts protruding upward while one end of each linear mounting part is fixed to the corresponding support part;
    (d) a plurality of conductive sensing parts electrically connected to the corresponding supporting parts while the conductive sensing parts are mounted to the respective mounting parts, the conductive sensing parts being elastically connected to electrode terminals of the battery cells; and
    (e) a connector mounted on the front supporting part or the rear supporting part for transmitting the sensed voltage of the battery cells to a battery management system (BMS).

2. The voltage sensing member according to claim 1, wherein the front supporting part and the rear supporting part are formed of a printed circuit board (PCB).

3. The voltage sensing member according to claim 1, wherein the mounting parts are formed of an elastic metal strip.

4. The voltage sensing member according to claim 1, wherein the sensing parts are formed of a conductive compression spring.

5. A battery module including a voltage sensing member according to claim 1.

6. The battery module according to claim 5, wherein the battery module comprises:
    (a) a battery cell stack including a plurality of battery cells or unit modules connected in series with each other, the battery cells or unit modules being erected in the lateral direction;
    (b) an upper case constructed in a structure to entirely surround one side end of the battery cell stack and to partially surround the upper and lower ends of the battery cell stack, the upper case being provided at the front part thereof with external input and output terminals;
    (c) a lower case coupled with the upper case, the lower case being constructed in a structure to entirely surround the other side end of the battery cell stack and to partially surround the upper and lower ends of the battery cell stack, the lower case being provided at the front part thereof with bus bars for connecting electrode terminals of the battery cell stack to the external input and output terminals, the lower case being provided at the bottom thereof with the voltage sensing member;
    (d) a front cover mounted to the front part of the lower case for protecting connections between the electrode terminals of the battery cells and the bus bars from the outside, the front cover being made of an insulative material; and
    (e) a battery management system (BMS) mounted to the rear part of the lower case, while being connected to the voltage sensing member, for monitoring and controlling the operation of the battery module.

7. The battery module according to claim 6, wherein the voltage sensing member includes mounting parts and sensing parts mounted in spaces defined on the front and rear parts of the lower case, and supporting parts and a conduction part mounted to the bottom of the lower case.

8. The battery module according to claim 7, wherein the lower case is provided at the bottom thereof with a depression in which the connection part is inserted, and the depression is provided at the inside thereof with a plurality of protrusions which are alternately oriented to stably fix the connection part inserted in the depression.

9. The battery module according to claim 6, wherein the battery cell stack comprises a plurality of unit modules each including plate-shaped battery cells having electrode terminals formed at the upper and lower ends thereof, and
    each unit module comprises two or more battery cells constructed in a stacked structure in which electrode terminals of the battery cells are connected in series with each other and the electrode terminal connections are bent such that the battery cells are stacked, and a pair of high-strength cell covers for surrounding the outer surfaces of the battery cells excluding the electrode terminals of the battery cells when the cell covers are coupled with each other.

10. The battery module according to claim 6, wherein the lower case is provided at the front and rear parts thereof with spaces in which supporting parts and sensing parts of the voltage sensing member are inserted, and the sensing parts are in elastic contact with the lower ends of the electrode terminals of the battery cells and/or series-connection bent regions (electrode terminal connections) of the electrode terminals of the battery cells.

11. The battery module according to claim 6, wherein the lower case is provided at the front part thereof with a pair of slits through which the outermost electrode terminals of the battery cell stack are inserted, and the outermost electrode terminals of the battery cell stack are inserted through the slits and then connected to the bus bars located at the front part of the lower case.

12. The battery .module according to claim 11, wherein the sensing parts of the voltage sensing member that are connected to the outermost electrode terminals are mounted on the supporting part such that downward-inclined ends of the sensing parts are rotated by a predetermined angle to face the insides of the outermost electrode terminals.

13. The battery module according to claim 7, further comprising:
    insulative covers further disposed on the outer surfaces of the supporting parts mounted to the bottom of the lower case.

14. The battery module according to claim 6, wherein the lower case is provided at the rear part thereof with a protruding BMS receiving part in which the BMS is received.

15. A middle- or large-sized battery system having high output and large capacity, the battery system being manufactured using a battery module according to claim 5 as a unit body.

16. The battery system according to claim 15, wherein the battery system is used as a power source for electric vehicles or hybrid electric vehicles.

\* \* \* \* \*